(12) United States Patent
Nakamura et al.

(10) Patent No.: US 9,363,450 B2
(45) Date of Patent: Jun. 7, 2016

(54) IMAGING SYSTEMS AND METHODS FOR IMAGE SIGNAL GAIN ADJUSTMENT

(71) Applicant: Semiconductor Components Industries, LLC, Phoenix, AZ (US)

(72) Inventors: Junichi Nakamura, Tokyo (JP); Shinichiro Matsuo, Kawasaki (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 16 days.

(21) Appl. No.: 14/468,242

(22) Filed: Aug. 25, 2014

(65) Prior Publication Data

US 2015/0062364 A1 Mar. 5, 2015

Related U.S. Application Data

(60) Provisional application No. 61/870,334, filed on Aug. 27, 2013.

(51) Int. Cl.
*H04N 5/355* (2011.01)
*H04N 5/378* (2011.01)
*H04N 5/3745* (2011.01)
*H04N 5/357* (2011.01)
*H01L 27/146* (2006.01)

(52) U.S. Cl.
CPC ........ *H04N 5/3559* (2013.01); *H01L 27/14609* (2013.01); *H04N 5/3575* (2013.01); *H04N 5/378* (2013.01); *H04N 5/37452* (2013.01); *H04N 5/35572* (2013.01)

(58) Field of Classification Search
None
See application file for complete search history.

(56) References Cited

U.S. PATENT DOCUMENTS

| | | | |
|---|---|---|---|
| 6,627,474 B2 | 9/2003 | Barna et al. | |
| 7,443,435 B2 | 10/2008 | Loose | |
| 7,518,646 B2 | 4/2009 | Zarnowski et al. | |
| 8,077,237 B2 | 12/2011 | Li | |
| 8,275,213 B2 | 9/2012 | Richardson | |
| 8,729,451 B2 | 5/2014 | Bikumandla | |
| 8,730,330 B2 | 5/2014 | Solhusvik et al. | |
| 8,748,798 B2 | 6/2014 | Zhang et al. | |
| 2004/0079977 A1* | 4/2004 | Ying | H04N 5/3559 257/292 |
| 2004/0251394 A1* | 12/2004 | Rhodes | H01L 27/14603 250/208.1 |
| 2012/0188427 A1* | 7/2012 | Solhusvik | H04N 5/3559 348/300 |
| 2012/0256077 A1* | 10/2012 | Yen | H01L 27/14609 250/208.1 |
| 2013/0048831 A1* | 2/2013 | Bikumandla | H04N 5/3598 250/208.1 |
| 2013/0141619 A1* | 6/2013 | Lim | H01L 27/14609 348/302 |

OTHER PUBLICATIONS

Velichko, U.S. Appl. No. 14/460,966, filed Aug. 15, 2014.

* cited by examiner

*Primary Examiner* — Justin P Misleh
(74) *Attorney, Agent, or Firm* — Treyz Law Group, P.C.; Michael H. Lyons

(57) ABSTRACT

An imaging system may include image processing circuitry and an image sensor having a pixel, readout circuitry, and control circuitry. The pixel may have a dual conversion gain gate for switching between a high conversion gain mode and a low conversion gain mode. The pixel may capture a first image signal while the dual conversion gain gate is turned of and a second image signal subsequent to capturing the first image signal while the dual conversion gain gate is turned on. The readout circuitry may identify a selected one of the first and second image signals to output to the image processing circuitry based on the first image signal. In this way, the readout circuitry may output a low conversion gain signal when saturating charge is stored on the charge storage region and may output a high conversion gain signal when insufficient charge is stored on the charge storage region.

10 Claims, 7 Drawing Sheets

IMAGING SYSTEMS AND METHODS FOR IMAGE SIGNAL GAIN ADJUSTMENT

This application claims the benefit of provisional patent application No. 61/870,334, filed Aug. 27, 2013, which is hereby incorporated by reference herein in its entirety.

BACKGROUND

This relates generally to imaging devices, and more particularly, to imaging devices having pixel arrays with selective gain pixel readout capabilities.

Image sensors are commonly used in electronic devices such as cellular telephones, cameras, and computers to capture images. In a typical arrangement, an electronic device is provided with an array of image pixels arranged in pixel rows and pixel columns. Row control circuitry is coupled to each pixel row over row control lines for providing pixel control signals to each image pixel in the pixel row. Image pixels are often operated in a low gain mode for capturing images of brighter scenery and in a high gain mode for capturing images of darker scenery.

In conventional imaging systems, row control circuitry provides global control signals to each pixel the array to instruct every pixel the array to operate in either the high gain mode or the low gain mode. However, scenes to be imaged often include both brighter and darker portions across the array. Performing image capture operations using conventional image sensors that control image pixels in a pixel array to operate in the high gain or loss gain mode may thereby cause some image pixels in the array to generate excessively noisy or over-saturated image signals, which can generate unsightly image artifacts in the final captured image.

It would therefore be desirable to be able to provide imaging devices with improved means of capturing and processing image signals.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
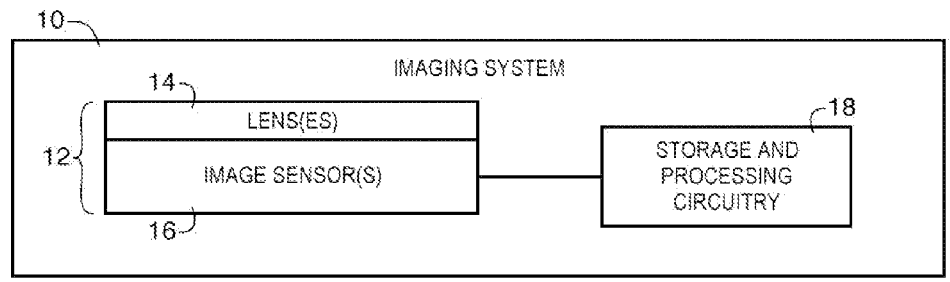
FIG. 1 is a diagram of an illustrative imaging system having an image sensor and processing circuitry in accordance with an embodiment of the present invention.

FIG. 1 is a diagram of an illustrative imaging system such as an electronic, device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities. or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits e.g. image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
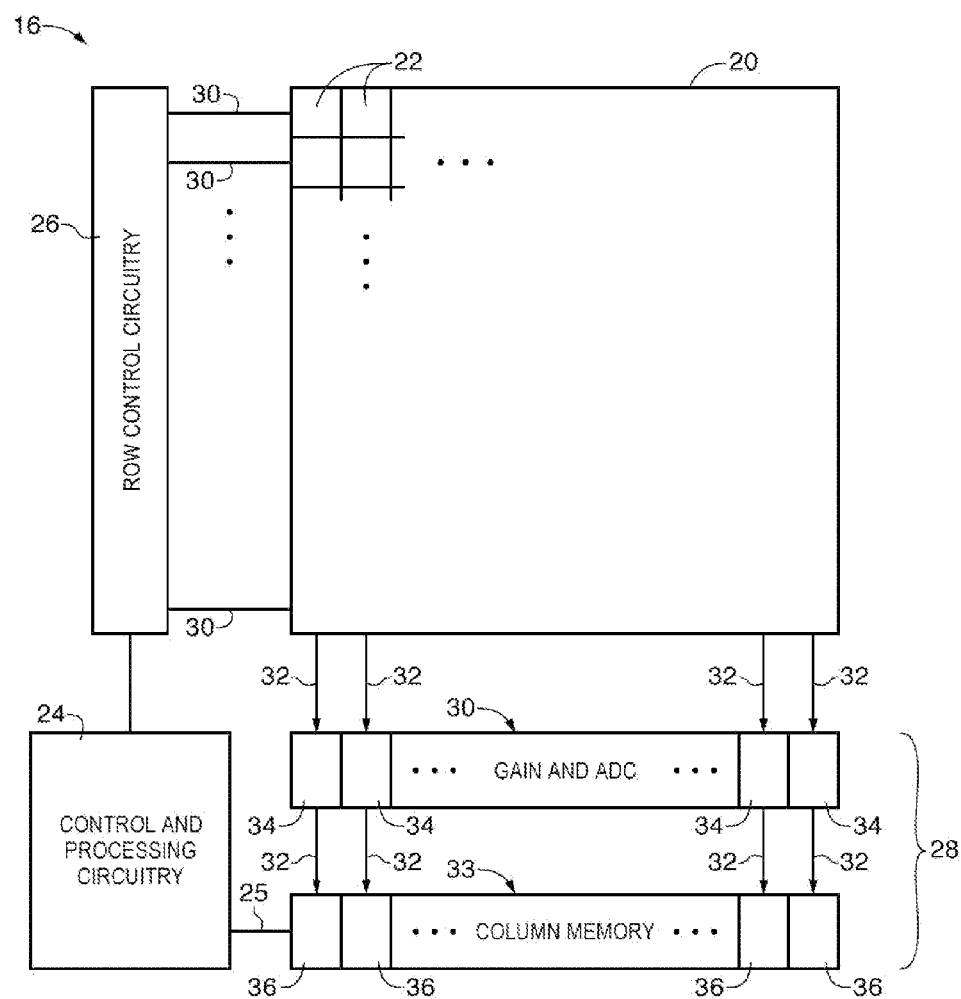
FIG. 2 is a diagram of an illustrative pixel array and associated column analog-to-digital convener circuits and corresponding column memory circuits in accordance with an embodiment of the present invention.

As shown in FIG. 2, image sensor 16 may include a pixel array 20 containing image sensor pixels 22 arranged in rows and columns (sometimes referred to herein as image pixels or pixels arranged in pixel rows and pixel columns) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, column decoder circuitry, or column control and readout circuitry). Row control circuitry 26 may receive row addresses from control circuitry 24 and supply corresponding row control signals such as reset, row select, charge transfer, and readout control signals to pixels 22 over row control paths 30. One or more conductive lines such as column lines 32 may be coupled to each column of pixels 22 in array 20. Column lines 32 may be used for reading out image signals from pixels 22, for supplying bias signals (e.g., bias currents or bias voltages), for supplying control signals to pixels 22, etc. If desired, during pixel readout operations, a pixel row in array 20 may be selected using row control circuitry 26 and image signals generated by image pixels 22 in that pixel row can be read out along column lines 32.

Column readout circuitry 28 may include gain and analog-to-digital converter (ADC) circuitry 34. Circuitry 34 may include amplifier circuitry, sample and hold circuitry, and ADC circuitry coupled to column lines 32. For example, circuitry 34 may include multiple circuit blocks 34 that are each coupled to a corresponding column line 32. Each gain and ADC circuit block 34 may be used for amplifying and converting image signals captured by pixels 22 in a corresponding column of array 20 (e.g., over a corresponding column line 32). ADC circuitry in blocks 34 may convert analog image signals captured by pixels 22 into digital image signals (sometimes referred to herein as digital pixel values or digital codes).

Column readout circuitry 28 may include column memory circuitry 33. Column memory circuitry 33 may include memory circuitry for storing digital image signals received from gain and ADC circuitry 34 (e.g., over column lines 32). Circuitry 28 may include memory circuits coupled to respective column lines 32. For example, circuitry 33 may include multiple memory blocks 36 that are each coupled to a corresponding column line 32 for receiving digital pixel, data from a corresponding gain and ADC block 34 (e.g., for storing pixel data captured by pixels 22 in a corresponding column of array 20).

Column memory 33 may output stored pixel data to control and processing circuitry 24 over path 25. For example, processing circuitry 24 may read out pixel data stored on memory blocks 36 over path 25. Processing circuitry 24 may include image processing circuitry that performs image processing operations on the received pixel data. If desired, processing circuitry 24 may provide the processed pixel data to additional image processing circuitry (e.g., processing circuitry 18 of FIG. 1), to external circuitry such as display circuitry, etc. Column memory 33 may include any desired memory circuit (e.g., latching circuits, flip-flop circuitry, buffer circuitry, register circuitry, volatile memory, non-volatile memory, etc.). If desired, comparator circuitry. bias circuitry, or any other desired image signal readout circuitry may be formed in gain and ADC circuitry 30 and/or memory circuitry 33.

Image pixels 22 may be operated in a low conversion gain mode for capturing images of brighter scenery and in a high conversion gain mode for capturing images of darker scenery. During image capture operations, portions of array 20 may capture image signals from darker portions of an imaged scene whereas other portions of array 20 may capture image signals from brighter portions of the imaged scene. If desired, pixels 22 array 20 may be provided with gain control signals by row control circuitry 26 and/or column readout circuitry 28. Gain control signals received by pixels 22 may adjust the gain of the pixels. For example, pixels 22 located in brighter regions of array 20 may be provided with control signals via control lines 32 and/or 30 that instruct those pixels to operate in a low conversion gain mode (e.g., to prevent over-saturation of the image pixels), whereas pixels 22 located in darker regions of array 20 may be provided with control signals that instruct those pixels to operate in a high conversion gain mode (e.g., to improve signal-to-noise ratio in the image signals captured by those pixels). If desired, pixels 22 may be sequentially operated in the high and low conversion gain modes to capture image signals using both of the high and low conversion gain modes in sequence. Gain control signals provided to pixels 22 may include, for example, dual conversion gain (DCC) control signals that are configured to adjust the charge storage capacity of a given pixel 22.

Figure 3:
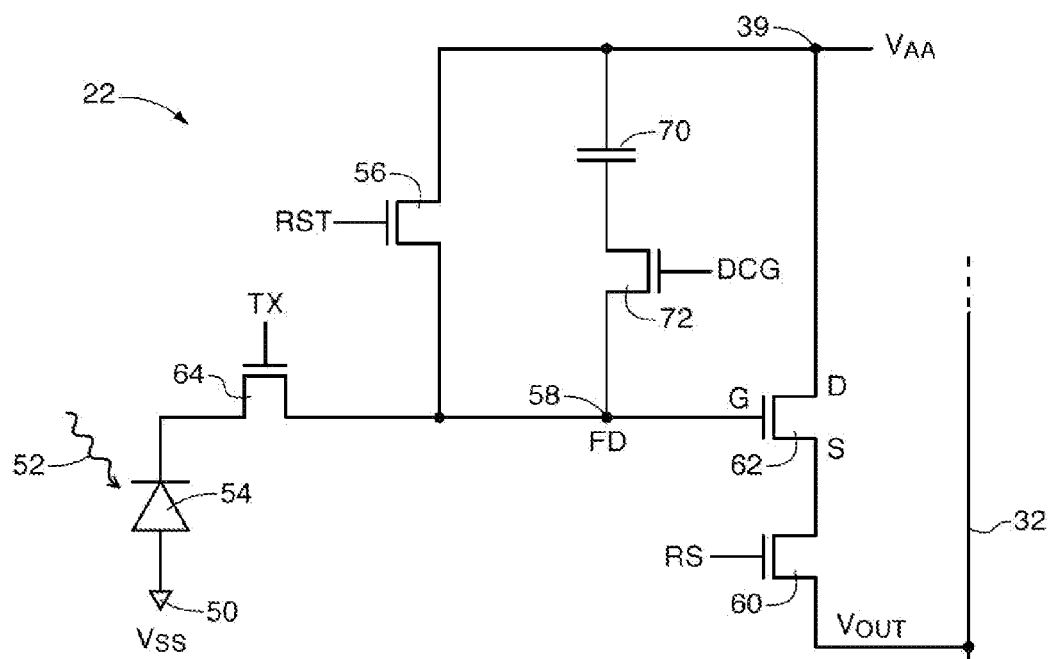
FIG. 3 is a circuit diagram of an illustrative image sensor pixel having a dual conversion gain gate for adjusting the conversion gain of the image sensor pixel in accordance with an embodiment of the present invention.

FIG. 3 is a circuit diagram of an illustrative image sensor pixel 22 in array 20 for operating in low and high conversion gain modes. A positive power supply voltage (e.g., voltage Vaa or another reset-level voltage) may be supplied at positive power supply terminal 39. A ground power supply voltage (e.g., Vss) may be supplied at ground terminal 50. Incoming light 52 may be collected by photodiode 54 (e.g., after passing through a corresponding color filter elements). Photodiode 54 converts the incoming light into electrical charge.

If desired. row control circuitry 26 (as shown in FIG. 2) may assert reset control signal RST before an image is acquired. This turns on reset transistor 56 and resets charge storage node 58 to Vaa or another reset-level voltage. Charge storage node 58 may sometimes be referred to herein as floating diffusion node FD or floating diffusion region FD. Charge storage node 58 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 54 (e.g., region 58 may have a corresponding charge capacity indicative of the amount of charge that can be stored at region 58). The signal associated with the stored charge on node 58 is conveyed to row select transistor 60 by source-follower transistor 62.

Photodiode 54 may be coupled to charge storage region 58 through charge transfer gate 64. Row control circuitry 26 may provide charge transfer control signal TX to the gate terminal of charge transfer gate 64. The reset control signal RST may be deasserted to turn off reset transistor 56 across a row of array 20. After the reset process is complete, transfer gate control signals TX may be asserted to turn on transfer gate 64. When transfer transistor 64 is turned on, the charge that has been generated by the photodiode 54 in response to incoming light 52 is transferred to charge storage node 58. When it is desired to read out the value of the stored charge (i.e., the value of the stored charge that is represented by the signal at the source S of transistor 62), row select control signal RS may be asserted (e.g., concurrently for all pixels in the selected row). When signal RS is asserted, transistor 60 turns on and a corresponding image signal $V_{OUT}$ that is representative of the magnitude of the charge on the corresponding charge storage node 54 (e.g., a reset-level or an image-level voltage/signal) is produced on output path 32 (e.g., column line 32). In a typical configuration, there are numerous rows and columns of image pixels such as image pixel 22 in image pixel array 20. When row select control signal RS is asserted in a given row, a path such as column line 32 may be used to route signal $V_{OUT}$ from that image pixel to a corresponding gain and ADC circuit block 34 associated with that column of array 20. If desired, reset-levels and image-levels may be sampled, held, and converted for each image pixel 22 to allow for kTC reset noise compensation via a correlated double sampling technique, for example. In such a technique, the image-level signals may be subtracted from the reset-level signals to mitigate kTC reset noise in the image signals.

Pixels 22 may be provided with gain selection circuitry that enhances the dynamic range of the images produced by image sensor 16. For example, each pixel 22 may generate a corresponding image signal using a selected, conversion gain setting (conversion gain mode). In some configurations, a selected gain setting may depend on the amount of light captured by the pixel during an exposure (i.e., an integration period between resets of the pixel during which a photosensitive element generates charges in response to incoming light). In other configurations, the gain may be kept at a constant setting. As shown in FIG. 3, image pixels 22 may include capacitor 70 and transistor 72 coupled in series between terminal 39 and floating diffusion node 58 (capacitor 70 may include any desired number of capacitors having any desired capacitance in any desired arrangement and any desired number of transistor 72 may be coupled between node 58 and any desired number of capacitors 70).

Transistor 72 may have a gate terminal that is controlled using dual conversion gain control signal DCG (e.g., received from row control circuitry 26 and/or column readout circuitry 28). Pixel 22 may be operable in a high conversion gain mode (high gain mode) and in a low conversion gain mode (low gain mode). If transistor 72 is disabled (e.g., if signal DCG is low), pixel 22 is placed in the high conversion gain mode. If transistor 64 is enabled (e.g., if signal DCC is high), pixel 22 is placed in the low conversion gain mode.

In general, pixel conversion gain is inversely proportional to the amount of loading capacitance at node FD. When transistor 72 is turned on, capacitor 70 is switched into use in order to provide floating diffusion node 58 with additional capacitance (e.g., additional charge storage capacity). This results in a lower conversion gain for pixel 22. When transistor 72 is turned off the additional loading of capacitor 70 is removed and pixel 22 reverts to a relatively higher pixel conversion gain configuration. The example of FIG. 3 is merely illustrative. Each pixel 22 may include any desired number of components for capturing image signals arranged in any desired manner.

During image capture and readout operations, pixels 22 may be sequentially operated in the high conversion gain mode and the low conversion gain mode (e.g., for sequentially capturing image signals in the high conversion gain mode and the low conversion gain mode and providing the image signals to column readout circuitry 28 for processing). Column memory circuitry 33 may include processing logic that process image signals captured by pixels 22 in the high and low conversion gain modes so that either an image signal captured using the low conversion gain mode or an image signal captured using the high conversion gain mode is stored on column memory 33 and read out by processing circuitry 24 (e.g., for use in a final image). In this way, logic in readout circuitry 28 may be used to actively select image signals generated with an appropriate dual conversion gain setting (e.g., depending on whether the pixel is located in a brighter or darker portion of the imaged scene).

Figure 4:
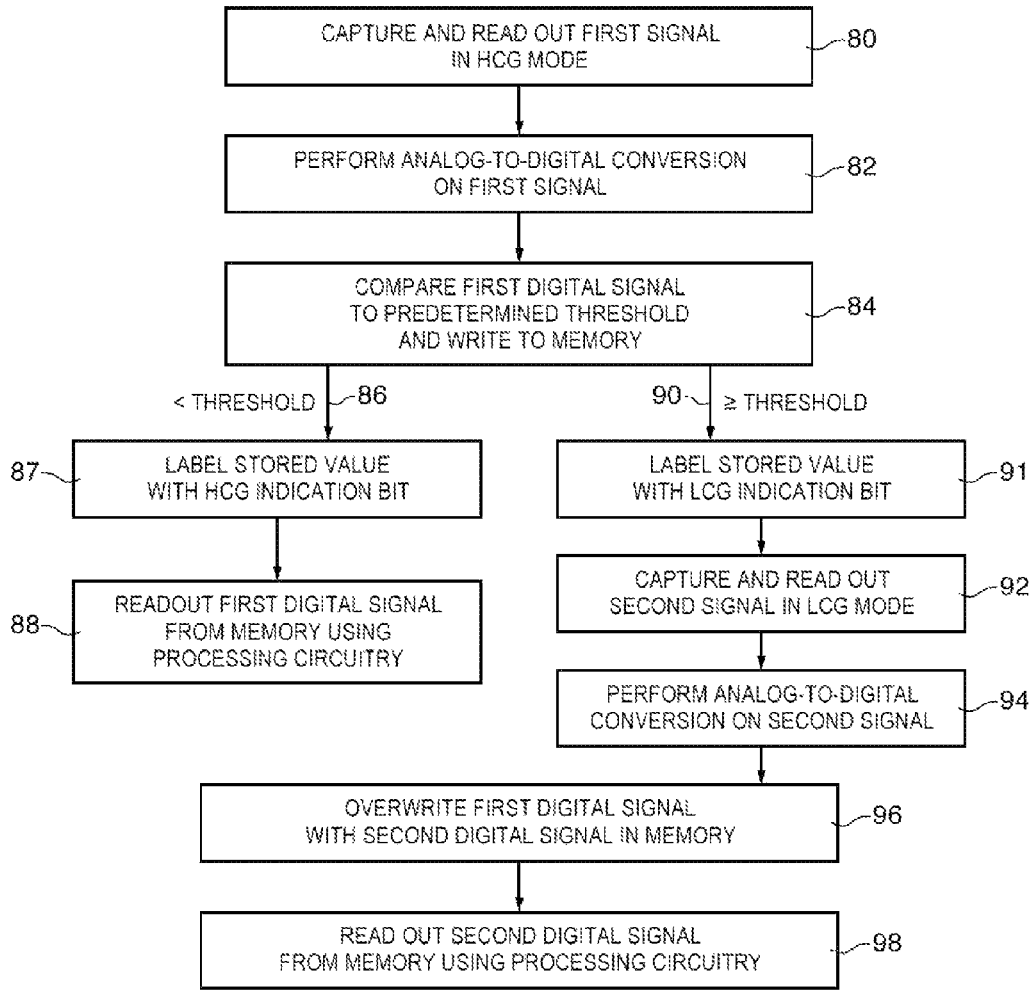
FIG. 4 is a flow chart of illustrative steps that may be performed by an image sensor for performing sequential high conversion gain and low conversion gain image captures and for actively determining whether to output image signals captured using the high conversion gain or the low conversion gain for a final image in accordance with an embodiment of the present invention.

FIG. 4 is a flow chart of illustrative steps that may be performed by image sensor 16 (e.g., as shown in FIG. 2) for capturing image signals using sequential high and low conversion gain modes and for determining whether the high or low conversion gain image signal is to be used for the final image output to image processing circuitry 24. The example described below illustrates image capture and readout for a single pixel 22 in array 20, but may be repeated across array 20 for capturing and reading out image signals from any desired number of pixels 22 in array 20 (e.g., from an entire row of array 20, from all of array 20, etc.).

At step 80, pixel 22 in array 20 may capture a first image signal in the high conversion gain mode (sometimes referred to herein as a first high conversion gain (HCG) image signal or a first analog HCG signal). For example, control circuitry 26 and or 28 may turn of DCG gate 72 in pixel 22 and pixel 22 may capture the first image signal while the corresponding DCG gate 72 is turned oil (e.g., while capacitor 70 is switched out of use). The first image signal may be output onto a corresponding column line 32 and ma be received by a corresponding gain and ADC circuitry block 34 (e.g., the first signal may be amplified by amplifier circuitry in block 34 and/or may be sampled and held onto one or more storage capacitors in block 34). If desired, the first image signal may include a first reset-level signal and a first image-level signal (e.g., for performing CDS operations on the image signal by computing difference values between the first reset and image level signals).

At step 82, gain and ADC circuit block 34 may perform analog-to-digital conversion operations (ADC operations) on the received first image signal to convert the received first image signal into a first digital image signal (e.g., a first digital pixel value). If desired, a first reset-level image signal may be sampled by circuit 34 and then converted to a first digital reset-level signal (pixel value), a first image-level signal may subsequently be sampled by circuit 34 and then converted to a first digital image-level signal, or a first difference value (e.g., obtained by subtracting the first analog reset-level signal from the first analog image-level signal) may be convened to a first digital difference value. The first digital image signal (e.g., the first digital reset-level signal, first digital image-level signal, and/or first digital difference signal) may be stored on the corresponding column memory circuit 36.

At step 84, comparator circuitry in circuit 36 may compare the first digital image signal to a predetermined (e.g., selected) threshold value. For example, column memory circuit 36 may include digital comparator circuitry (e.g., digital comparison logic) that compares the first digital image signal to the selected threshold value. In one suitable arrangement, the comparator circuitry compares the first digital difference signal (e.g., computed between the first reset-level and image-level signal) to the threshold value for mitigating kTC reset noise. The selected threshold value may be any desired threshold for determining whether excessive charge has been stored on storage node 58 of the corresponding pixel 22. As one example, the selected threshold value may be a saturation level or maximum voltage level (or based on the saturation level) of storage node 58 of pixel 22. For example, the threshold value may be 100% of the saturation level of storage region 58, 90% of the saturation level of storage region 58, 80% of the saturation level of Storage region 58, or any other desired value to value less than or equal to 100% of the saturation level, less than or equal to 90% of the saturation level, less than or equal to 80% of the saturation level, etc.). In the illustrative example described herein, the threshold value is selected such that the first digital image signal is compared to a voltage level at which the charge storage capacity of storage region 58 in pixel 22 is sufficiently full (e.g., sufficiently saturated with charge).

If the comparator logic in column circuit 36 determines that the first digital image (difference) signal is less than (e.g., does not exceed) the selected threshold value (e.g., that the charge storage region on pixel 22 is sufficiently unsaturated such as when pixel 22 is located within relatively darker portions of the imaged scene), processing may proceed to step 87 as shown by path 86.

At step 87, column circuit 36 may label the stored first digital image signal (e.g., stored first digital difference value) with a corresponding high conversion gain indication bit. The indication bit may identify that the stored first digital image signal was captured using the high conversion gain mode and may instruct readout circuitry 28 not to overwrite the stored first digital image signal with an image signal captured using pixel 22 in the low conversion gain mode.

At step 88, processing circuitry 24 may read out the stored first digital image signal (e.g., the stored first digital difference signal) from memory circuit 36. Processing circuitry 24 may perform any desired additional image processing operations on the read-out first digital image signal. The read-out first digital image signal may be used for generating a final image. If desired, pixel 22 may also perform image capture and readout operations using the low conversion gain mode subsequent to capturing the first image signal (e.g., by capturing a second image signal with DCC gate 72 turned on). However, the high conversion gain indication bit may instruct readout memory circuit 36 to prevent the stored first digital image signal from being overwritten by the low conversion gain mode image signal.

If the comparator logic determines that the first digital image signal is greater than or equal to (exceeds) the selected threshold value (e.g., that the charge storage region on pixel 22 is sufficiently saturated with charge such as when the pixel is located in a brighter portion of the imaged scene), processing may proceed to step 91 as shown by path 90.

At step 91, column circuit 36 may label the stored first digital image signal with a corresponding low conversion gain indication bit. The low conversion gain indication bit may identify that the stored first digital image signal is to be overwritten with an image signal captured using the low conversion gain mode. The low conversion gain indication bit may instruct readout circuitry 28 to overwrite the stored first digital image signal with an image signal captured using pixel 22 in the low conversion gain mode.

At step 92, pixel 22 may capture a second image signal in the low conversion gain mode. For example, control circuitry 26 and/or 28 may turn on DCC gate 72 in pixel 22. (e.g., by asserting DCC control signals with a relatively high magnitude to gates 72) and pixel 22 may capture the second image signal while the corresponding DCC gate 72 is turned on (e.g., while capacitor 70 is switched into use). The second image signal may be output onto a corresponding column line 32 and may be received by a corresponding gain and ADC circuitry block 34 (e.g., the second signal may be amplified by amplifier circuitry in block 34 and/or may be sampled and held onto one or more storage capacitors in block 34). If desired, the second image signal may include a second reset-level signal and a corresponding second image-level signal (e.g., for performing CDS operations on the image signal).

At step 94, gain and ADC block 34 may perform analog-to-digital conversion operations on the received second image signal to convert the received second image signal into a second digital image signal (e.g., a second digital pixel value). If desired, a second reset-level image signal may be sampled by circuit 34 and then converted to a second digital reset-level signal, a second image-level image signal may subsequently be sampled by circuit 34 and then converted to a second digital image-level signal, or a second difference value (e.g., obtained by subtracting the second analog image-level signal from the second analog reset-level signal) may be converted to a second digital difference signal (second digital difference value).

At step 96, the second digital image signal (e.g., the second digital reset-level signal, second digital image-level signal, and/or second digital difference signal) may be stored on the corresponding column memory circuit 36 by overwriting the stored first digital image signal (e.g., the low conversion gain indication bit appended to the stored first digital image signal may instruct memory circuit 36 to overwrite the stored first digital image signal with the second digital image signal).

At step 98, processing circuitry 24 may read out the stored second digital image signal (e.g., second digital difference signal) from memory circuit 36. Processing circuitry 24 may perform any desired additional image processing operations on the read out second digital image signal. The read-out second digital image signal may be used for generating a final image. In this way, an appropriate image signal (e.g., a high conversion gain image signal or a low conversion gain image signal) may be autonomously readout for each pixel 22 by processing circuitry 24 (e.g., so that pixels 22 in darker portions of the image have sufficient signal-to-noise ratio and brighter portions of the image are not oversaturated).

Figure 5:
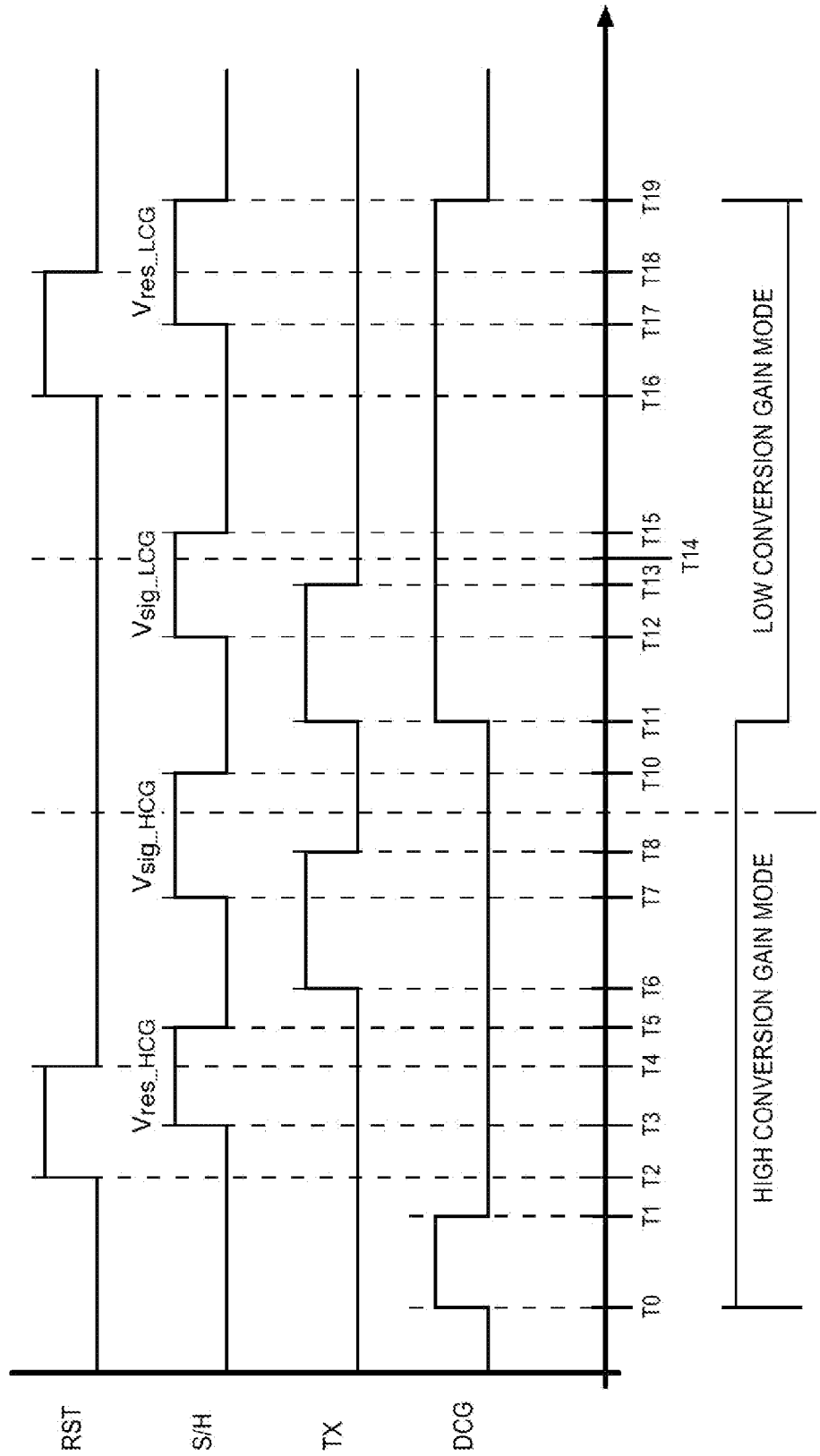
FIG. 5 is an illustrative timing diagram showing how an image pixel may be operated in sequential high and low conversion gain modes to capture first and second image signals using the high and low conversion gains in accordance with an embodiment of the present invention.

FIG. 5 is an illustrative timing diagram showing how pixel 22 may be operated in sequential high and low conversion gain modes for generating the first and second image signals described above in connection with FIG. 4, As shown in FIG. 5, control signals such as row select control signal RS, reset control signal RST, and charge transfer signal TX, and dual conversion gain control signal DCG may be provided to pixel 22 by row circuitry 26 and/or column circuitry 28. Sample and hold control signal Sill may be provided to readout circuitry 28 for performing sample and hold operations on image signals received from pixel 22 (e.g., signals S/H may be asserted concurrently with row select signal RS provided to pixel 22 for reading out the signals).

At time T0, dual conversion gain control signal DCG may be asserted to turn on dual conversion gain transistor 72. Dual conversion gain control signal DCG may be deasserted to turn off transistor 72 at time T1.

At time T2, row control circuitry 26 may assert reset control signal RST to turn on reset gate 56. At time T3, sample and hold signal S/H may be asserted to read out a first reset-level signal from storage node 58 onto gain and ADC circuit 34 (e.g., a first reset-level signal Vres_HCG), Reset gate 56 may be turned of by deasserting reset control signal RST at time T4. Sample and hold signal S/H may be deasserted at time T5.

At time T6, row control circuitry 26 may assert charge transfer control signal TX to enable charge transfer gate 64 on pixel 22 to transfer charge generated by photodiode 54 onto charge storage region 58. At time T7, sample and hold signal Sill may be reasserted to begin sampling the transferred charge on node 58 (e.g., a first image-level signal Vsig_HCG from node 58 that is equal to the charge on node 58 divided by the capacitance of floating diffusion region 58) onto gain and ADC circuit block 34 (while pixel 22 is in the high conversion gain (HCG) mode).

At time T8, charge transfer signal TX may be deasserted to turn off transfer gate 64. At time T10, sample and hold signal may be deasserted to end sampling and holding of the first image signal onto block 34. As an example, steps 80-84 of FIG. 4 may be performed between times TI and T10 of FIG. 5 (e.g., pixel 22 may capture the first image signal in the high conversion gain mode. ADC block 34 may convert the captured first image signal to a first digital image signal, and may compare to the signal to the predetermined threshold to determine whether the first digital image signal should be overwritten by a low conversion gain image signal, etc.).

At time T11, dual conversion gain control signal DCG may be reasserted to turn on DCG gate 72 to place pixel 22 into the low conversion gain mode. Charge transfer signal TX may be reasserted at time T11 to transfer the second image-level signal onto storage node 58 while DCG gate 72 is turned on. At time T12, sample and hold signal S/H may be reasserted to transfer the second image-level signal (e.g., a second image level signal Vsig_LCG that is equal to the charge on node 58 divided, by a sum of the capacitance of node 58 and the capacitance of DCG capacitor 70) on storage node 58 onto the corresponding gain and ADC block 34 while pixel 22 is in the low conversion gain (LUG) mode. At time T13, transfer signal TX may be deasserted to turn off transistor TX. Sample and hold signal S/H may be deasserted at time T15.

At time T16, reset signal RST may be reasserted to turn on reset transistor 56 and to reset charge storage node 58. Sample and hold signal Sill may be asserted at time T17 to sample and hold a second reset-level signal (e.g., Vres_LCG) onto circuit block 34 (while pixel 22 is in the low conversion gain mode). Reset signal RST may be deasserted at time T18 and sample and hold signal S/H may be deasserted at time T19. Dual conversion gain signal DCG may be deasserted at time T19 to turn off DCG gate 72. The example of FIG. 5 is merely illustrative. In general, the signals shown in FIG. 5 may be provided at any desired times in any desired order.

Figure 6:
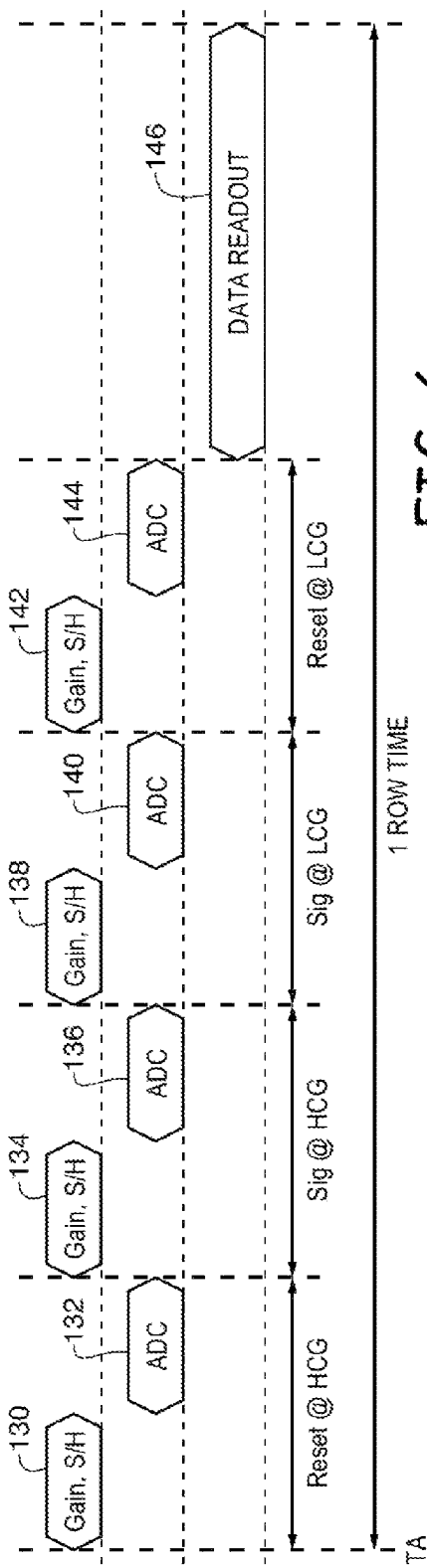
FIG. 6 is an illustrative timing chart showing how column readout circuitry may perform correlated double sampling operations to mitigate kTC reset noise in a digital domain after converting analog image signals to digital image signals in accordance with an embodiment of the present invention.

If desired, correlated double sampling (CDS) operations may be performed before or after converting the image signals to digital image signals. FIG. 6 is an illustrative timing chart showing how digital CDS operations may be performed on the sampled digital image signals after converting the signals to digital signals.

At time TA, a first reset-level signal is sampled and held at circuitry block 34 (as shown by timing block 130). If desired, amplifier circuitry may provide a desired gain to the reset-level signals. The first reset-level signal sampled and held during time period 130 may be a high conversion gain signal captured by pixel 22 while DCG gate 72 is turned off. During time period 132, ADC circuitry in block 34 may perform analog-to-digital conversion operations (e.g., to generate a corresponding digital code) on the first reset-level signal sampled and held during time period 130 to generate the first digital reset-level signal.

During time period 134, the first image-level signal is sampled and held onto circuitry block 34. The first image-level signal sampled and held during time period 134 may be a high conversion gain signal captured by pixel 22 while DCG gate 72 is turned off. During time period 136, ADC circuitry in block 34 may perform analog-to-digital conversion operations on the first image-level signal sampled and held during time period 134 to generate a first digital image-level signal. CDS operations (e.g., computing difference values between the first digital reset and image level signals) may be performed on the first image signals captured by pixel 22 in the digital domain in this example (e.g., using the signals converted during time periods 132 and 136).

During time period 138, a second signal-level signal is sampled and held at circuitry block 34. The second signal-level signal sampled and held during time period 138 may be a low conversion gain signal captured by pixel 22 while DCG gate 72 is turned on. During time period 140, ADC circuitry in block 34 may perform analog-to-digital conversion operations on the second image-level signal sampled and held during time period 138 to generate the second digital image-level signal.

During time period 142, a second reset-level signal is sampled and held onto circuitry block 34. The second reset-level signal may be a low conversion gain signal captured while DCG gate 72 is turned on. During time period 144, ADC circuitry in block 34 may perform analog-to-digital conversion operations on the second reset-level signal to generate the second digital reset-level signal. CDS operations may be performed on the second image signals captured by pixel 22 in the digital domain (e.g., by computing difference values for the second digital reset and image levels). During time period 146, the CDS corrected digital data (e.g., corresponding digital image codes) may be read out from column circuitry 28 (e.g., by processing circuitry 24). The sequence illustrated by FIG. 6 may form one row time, where a frame time is equal to a constant times one row time plus a vertical blanking time. FIG. 6 is merely illustrative. If desired, the second reset-level signal may be sampled and converted prior to sampling and converting the second image-level signal.

Figure 7:
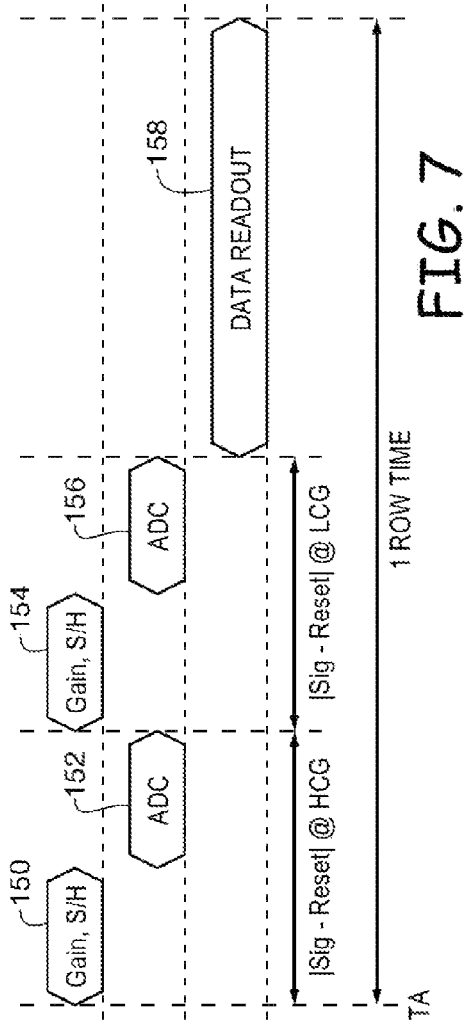
FIG. 7 is an illustrative timing chart showing how column readout circuitry may perform correlated double sampling operations to mitigate kTC reset noise in an analog domain before converting the mitigated analog image signals to digital image signals in accordance with an embodiment of the present invention.

FIG. 7 is an illustrative timing chart showing how analog CDS operations may be performed prior to analog to digital conversion of the image signals.

At time TA, a first difference signal (e.g., computed by subtracting the analog first image-level signal captured by pixel 22 in the HCG mode from the analog first reset level signal captured by pixel 22 in the HCG mode) is sampled and held (e.g., during time period 150). The sampled first difference signal has already been compensated for kTC reset noise and therefore no further CDS operations need be performed on the signals in the digital domain. During time period 152, the sampled and held first difference signal may be converted using, ADC circuitry in circuit block 34.

During time period 154, a second difference signal (e.g., computed by subtracting the analog second image-level signal captured by pixel 22 in the LCG mode from the analog second reset-level signal captured by pixel 22 in the LCG mode) is sampled and held. The sampled second difference signal has already been compensated for kTC reset noise and therefore no further CDS operations need be performed on the signals. During time period 156, the sampled and held second difference signal may be converted using ADC circuitry in circuit block 34.

During time period 158, the CDS corrected digital data (e.g., corresponding digital image codes) may be read out from column circuitry 28 (e.g., by processing circuitry 24). The sequence illustrated by FIG. 7 may form one row time, for example.

Figure 8:
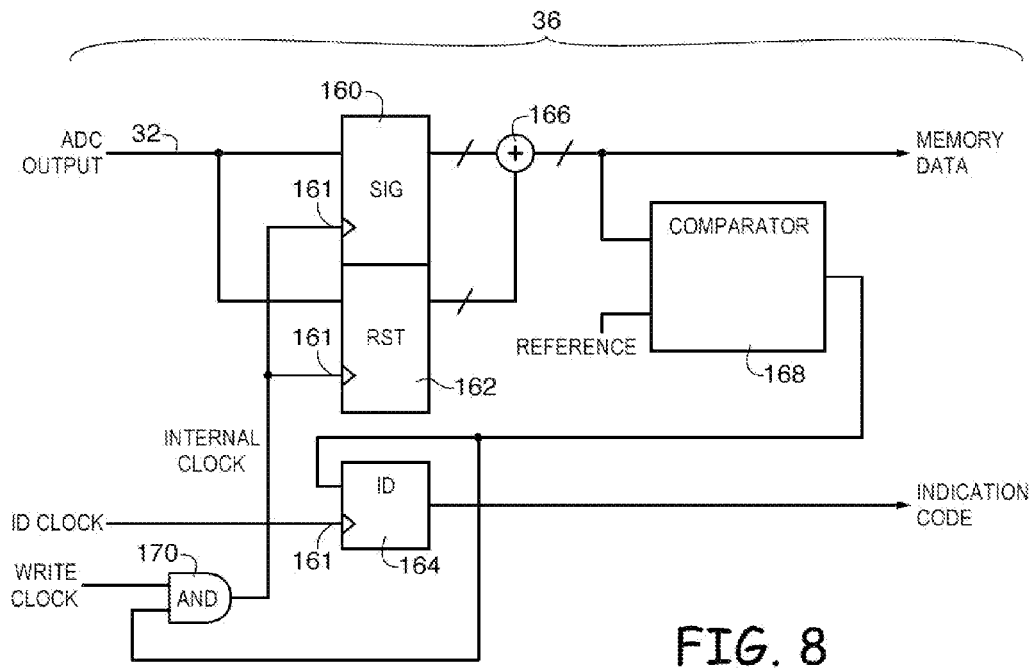
FIG. 8 is an illustrative circuit diagram showing how column memory circuitry may control whether image signals captured using a high conversion gain or image signals captured using a low conversion gain are read out to image processing circuitry based on the image signals captured using the high conversion gain in accordance with an embodiment of the present invention.

FIG. 8 is an illustrative circuit diagram showing how a given memory circuit block 36 may output one of the first (HCG) or second (LCG) image signals (e.g., as described in connection with FIG. 4) based on whether the first image signal (gathered using the high conversion gain mode) exceeds the predetermined threshold (e.g., so that the first image signal is read out by processing circuitry 24 when the first image signal is less than the threshold and the second image signal is read out when the first image signal exceeds the threshold).

As shown in FIG. 8, the output of the ADC circuitry in block 34 of gain and ADC circuitry 30 (FIG. 2) may be provided to storage circuitry such as image-level signal storage circuit 160 and reset-level signal storage circuit 162 over column line 32 (e.g., storage circuits 160 and 162 may be flip-flop circuits having corresponding clock inputs 161). Flip-flop 160 may store the first image-level signal received over line 32 from ADC block 34 when an internal clock signal is asserted at the corresponding clock input 161. Flip-flop 162 may store the first reset-level signal received over line 32 when the internal clock signal is asserted at the corresponding clock input 161. Flip-flops 160 and 162 may output the stored first image-level and first reset-level signals to subtracting circuit 166. Subtracting circuit 166 may subtract the first image-level signal received from flip-flop 160 from the first reset-level signal received from flip-flop 162 to generate a corresponding first difference value (HCG difference value). The first difference value may be provided as memory data to additional memory circuitry in memory circuit 36 and/or to other processing circuitry such as processing circuitry 24.

The first difference value output by subtracting circuit 166 may be provided to a first input of comparator circuit 168. Comparator circuit 168 may receive a reference value (e.g., the predetermined threshold value) at a second input and may compare the first difference value to the threshold value, if the difference value is less than the threshold value (e.g., as described in connection with path 86 of FIG. 4), comparator 168 may output a low signal (e.g., a logic. "0") to a first input of indication code storage circuit 164. If the difference value is greater than or equal to the threshold value (e.g., as described in connection with path 90 of FIG, 4), comparator 168 may output a high signal (e.g., a logic "1") to the first input of storage circuit 164.

Indication code storage circuit 164 may be a flip-flop circuit that receives an ID clock signal at a second input and that outputs the signal received from comparator 168 as an indication code (indication hit) when the ID clock signal is asserted. For example, when comparator 168 determines that the first difference value exceeds the threshold value (e.g., when comparator 168 outputs a logic flip-flop 164 may output a logic "1" as the indication code, thereby labeling the corresponding memory data output of subtracting circuit 166 with the logic "1" indication code associated with the need for a low conversion gain signal to be recorded from the pixel 22 (e.g., as described in connection with step 91 of FIG. 4). When comparator 168 determines that the first difference value is less than the threshold value (e.g., when comparator 168 outputs a logic "0"), flip-flop 164 may output a logic "0" as the indication code, thereby labeling the memory data output of subtracting circuit 166 with the logic "0" indication code (e.g., as described in connection with step 87 of FIG. 4). The indication code output by flip-flop 164 may control flip-flops 160 and 162 to overwrite or to not overwrite the stored first image signal with the low conversion gain second signal.

The output of ID flip-flop 164 may be coupled to a first input of logic AND gate 170. AND gate 170 may receive, a write clock signal at a second input. The output of AND gate 170 may form the internal clock signal provided to clock inputs 161 of flip-flops 160 and 162. When the write clock signal is asserted and when ID flip-flop 164 outputs a logic "1" (e.g., when the first difference value exceeds the threshold value). AND gate 170 may output a logic "1" that instructs storage circuits 160 and 162 to overwrite the stored high conversion gain first signals with low conversion gain second signals received over line 32 (e.g., as described in connection with step 96 of FIG. 4). In this way, the first (HCG) digital (difference) signals may be readout by processing circuitry 24 when insufficient charge is gathered by pixel 22 to saturate storage region 58 (e.g., such as when pixel 22 is located in a darker portion of the image) and the second (LCG) digital (difference) image signals may be read out by processing circuitry 24 when storage region 58 is sufficiently saturated with charge (e.g., such as when pixel 22 is located, in a brighter portion of the image).

Figure 9:
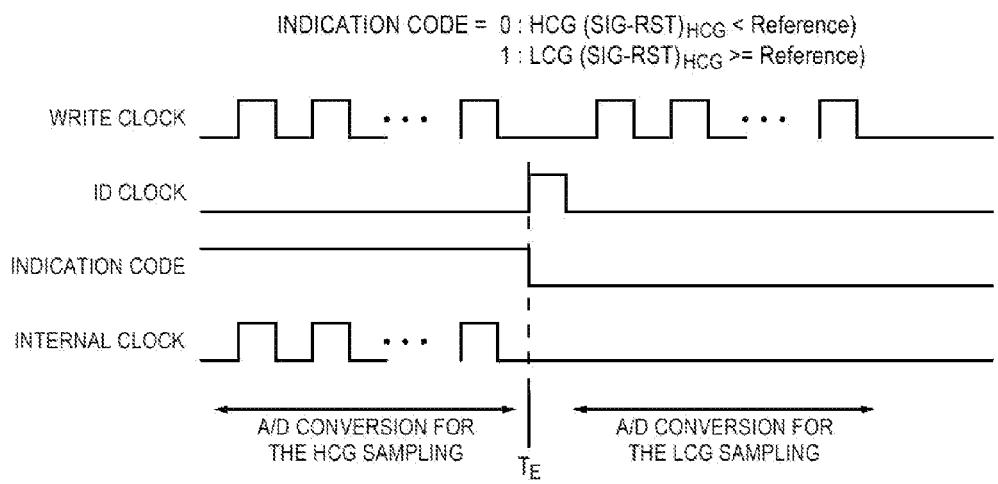
FIG. 9 is an illustrative timing diagram showing how column memory circuitry of the type shown in FIG. 8 may prevent overwriting of image signals captured using a high conversion gain with image signals captured using a low conversion gain in response to determining that the image signals captured with the high conversion gain exceed a predetermined threshold in accordance with an embodiment of the present invention.

FIG. 9 is an illustrative timing diagram that shows how the internal clock signal, ID dock signal, write clock signal, and indication code shown in FIG. 8 may be controlled when comparator 168 determines that the first difference signal does not exceed the predetermined threshold. At time TE, the ID clock signal provided to ID flip-flop 164 may be asserted in order to output the low signal received from comparator 168 as the indication code (e.g., because the first difference value is less than the threshold value in this scenario). The first input of AND gate 170 will thereby receive a logic "0," keeping the internal clock signal provided to clock inputs 161 of flip-flops 160 and 162 low and preventing flip-flops 160 and 162 from writing new data over the stored data (e.g., preventing flip-flops 160 and 162 from overwriting the stored first image and reset level signals from the HCG mode with second image and reset level signals from the LCG mode).

Figure 10:
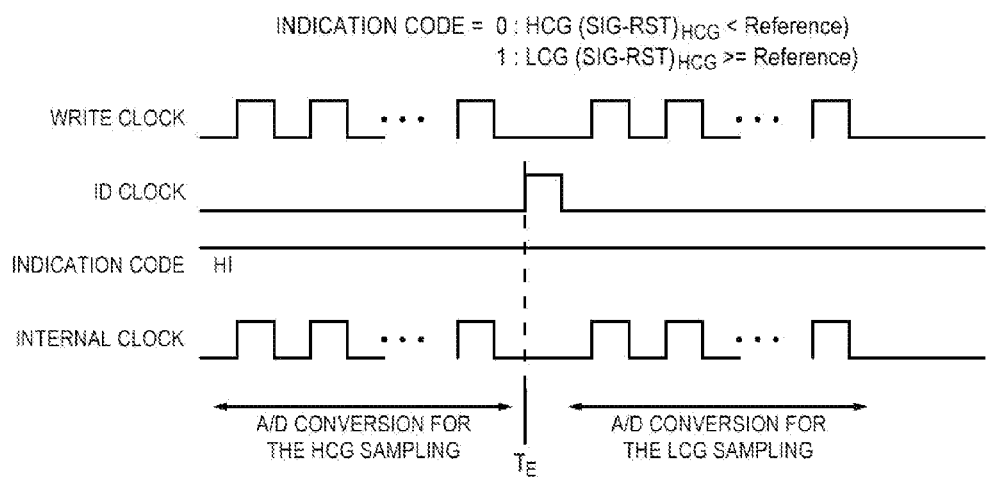
FIG. 10 is an illustrative timing diagram showing how column memory circuitry of the type shown in FIG. 8 may enable overwriting of image signals captured using a high conversion gain with image signals capturing with a low conversion gain in response to determining that the image signals captured with the high conversion gain are less than the predetermined threshold in accordance with an embodiment of the present invention.

FIG. 10 is an illustrative timing diagram showing how the internal clock signal. ID clock signal, write clock signal, and indication code shown in FIG. 8 may be controlled when comparator 168 determines that the first difference signal exceeds the predetermined threshold. At time TE, the ID clock signal provided to flip-flop 164 may be asserted to output the high signal received from comparator 168 as the indication code (e.g., because the first difference value is greater than or equal to the threshold value in this scenario). The first input of AND gate 170 will thereby receive a logic "1," allowing the internal clock signal provided to clock inputs 161 of flip-flops 160 and 162 to be pulsed high when the write clock signal is asserted, to enable flip-flops 160 and 162 to write new data over the stored data (e.g., enabling flip-flops 160 and 162 to overwrite the stored first image and reset level signals from the HCG mode with second image and reset signals from the LCG mode).

The example of FIGS. 8-10 is merely illustrative. If desired, the timing and circuitry may be modified to match the analog CDS case (as described in connection with FIG. 7).

The output image data received, by processing circuitry 24 may be used to generate high intra-scene dynamic range using the digital codes and the indication code for each pixel. As an example, assuming that the conversion gain ration is 4:1 and the ADC bit width is 12 bits, the resulting image may have 14 bit resolution. If desired, the conversion gain ratio may be 2:1. In this scenario, digital codes for signals that are captured in the LCG mode (e.g., the second signals) are multiplied by two digitally (or by a number M in case the conversion, gain ratio is M:1). Then, identical digital signal processing may applied to all digital codes captured in both the HCG mode and the LCG mode to generate a reproduced image. If desired, dithering may be applied, to the digital codes that are captured in the LCG mode when the digital multiplication by the number M is performed.

In some scenarios, column amplifier gain may be used to amplify the signals. As an example, a column gain of 2× may be provided by the column amplifier for the HCG sampling. When the 2× column gain is applied for the HCG sampling, the maximum handling charge becomes ½ and the slope of the resulting digital codes (when plotted against exposure) becomes twice as large. Applying the same digital signal processing results in an additional 2× enhancement in dynamic range in this example. In this case, information of the column gain setting (e.g., 2× in this case) may be provided to the digital signal processing block in readout circuitry 28 and/or circuitry 24. This combination of pixel dual conversion gains and column amplifier gain is effective for scenes where the brightness difference between the dark portions and bright portions of the image is extremely large. Implementing these methods and systems may allow for improvement in the intra-scene dynamic range of the final image without significant increase in silicon area occupied by sensor 16 (for example), and a lower noise floor may be realized due to earlier stage gaining, lower power consumption, and smaller size.

Figure 11:
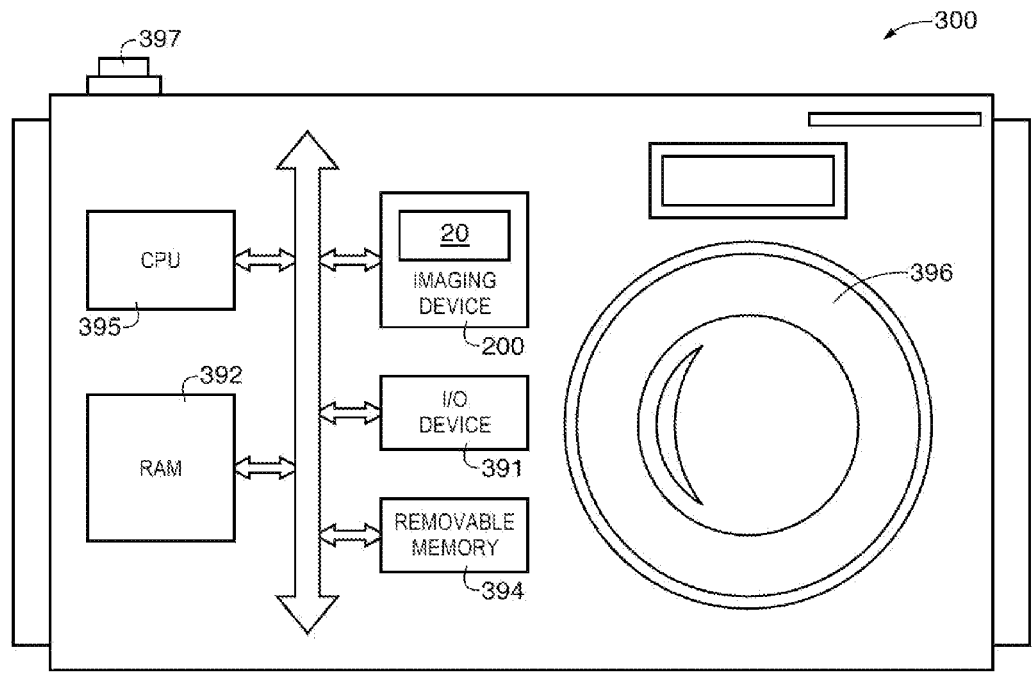
FIG. 11 is a block diagram of a processor system employing the embodiments of FIGS. 1-10 in accordance with an embodiment of the present invention.

FIG. 11 shows in simplified form a typical processor system 300, such as a digital camera, which includes an imaging device 200 (e.g., an imaging device 200 such as device 10 of FIGS. 1-10). The processor system 300 is exemplary of a system having digital circuits that could include imaging device 200. Without being limiting, such a system could include a computer system, still or video camera system, scanner, machine vision, vehicle navigation, video phone, surveillance system. auto focus system, star tracker system, motion detection system, image stabilization system, and other systems employing an imaging device.

The processor system 300 generally includes a lens 396 for focusing an image on pixel array 20 of device 200 when a shutter release button 397 is pressed, central processing unit (CPU) 395, such as a microprocessor which controls camera and one or more image flow functions, which communicates with one or more input/output (I/O) devices 391 over a bus 393. Imaging device 200 also communicates with the CPU 395 over bus 393. The system 300 also includes random access memory (RAM) 392 and can include removable memory 394, such as flash memory, which also communicates with CPU 395 over the bus 393. Imaging device 200 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating systems and methods for generating images using an image sensor pixel array having readout circuitry for selecting high conversion gain image signals or low conversion gain image signals to output to image processing circuitry.

An imaging system may include an image sensor coupled to image processing circuitry. The image sensor may include an array of image sensor pixels, pixel readout circuitry. and pixel control circuitry. The array may include an image sensor pixel having a dual conversion gain gate coupled between a charge storage node and a capacitor for switching the pixel between a high conversion gain mode and a low conversion gain mode. The image sensor pixel may capture to first image signal while the dual conversion gain gate is turned off (e.g., while the control circuitry provides a dual conversion gain signal to the dual conversion gain gate with a low magnitude) and may capture a second image signal subsequent to capturing the first image signal while the dual conversion gain gate is turned on (e.g., while the control circuitry asserts the dual conversion gain signal with a high magnitude).

The readout circuitry may readout (sample and hold) the first and second image signals and may convert the first and second image signals into respective first and second digital image signals using converter circuitry. The readout circuitry may identify a selected one of the first and second digital image signals to output to the image processing circuitry based on the captured first digital image signal (e.g., based on the magnitude of the captured first image signal). The readout circuitry may include a memory circuit that stores the first image signal. Logic circuitry (e.g., comparator circuitry) may determine whether the first image signal exceeds a predetermined threshold. In response to determining that the first image signal does not exceed the predetermined threshold, the readout circuitry may output the first image signal to the image processing circuitry, in response to determining that the first image signal exceeds the predetermined threshold, the logic circuitry may instruct the memory circuitry to over-write the first image signal with the second image signal.

If desired, the logic circuitry may label the first image signal with an indication bit that instructs the memory to overwrite the first image signal with the second image signal or that instructs the memory not to overwrite the first image signal. In this way, the readout circuitry may output a low conversion gain signal when excessive charge is stored on the charge storage region and may output a high conversion gain signal when insufficient charge is stored on the charge storage region. The low conversion gain signal may allow for a final image without over-saturating the image signals and the high conversion gain signal may allow for sufficient signal-to-noise ratio in the image signals regardless of whether individual pixels are located in bright or dark portions of the image.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of operating an image sensor coupled to image processing circuitry, wherein the image sensor comprises an array of image sensor pixels and readout circuitry, the method comprising:

with an image sensor pixel in the array, capturing a first image signal while a dual conversion gain gate in the image sensor pixel is turned off;

with the image sensor pixel, capturing a second image signal subsequent to capturing the first image signal while the dual conversion gain gate is turned on;

with a memory circuit in the readout circuitry, storing the first image signal;

with the readout circuitry, identifying a selected one of the first and second image signals to output to the image processing circuitry based on the captured first image signal, wherein identifying the selected one of the first and second image signals to output to the image processing circuitry comprises:

determining whether the first image signal exceeds a predetermined threshold; and in response to determining that the first image signal does not exceed the predetermined threshold, labeling the first image signal with an indication bit that instructs the readout circuitry not to overwrite the first image signal on the memory circuit; and with the readout circuitry, outputting the identified image signal to the image processing circuitry.

2. The method defined in claim 1, wherein the image sensor further comprises control circuitry, the method further comprising:

with the control circuitry, asserting a dual conversion gain control signal provided to the dual conversion gain gate to turn on the dual conversion gain gate after the image sensor pixel has captured the first image signal.

3. The method defined in claim 1, wherein identifying the selected one of the first and second image signals to output to the image processing circuitry further comprises:

in response to determining that the first image signal does not exceed the predetermined threshold, outputting the first image signal to the image processing circuitry.

4. The method defined in claim 1, wherein identifying the selected one of the first and second image signals to output to the image processing circuitry further comprises:

in response to determining that the first image signal exceeds the predetermined threshold, overwriting the first image signal on the memory circuit with the second image signal.

5. The method defined in claim 4, wherein identifying the selected one of the first and second image signals to output to the image processing circuitry further comprises:

in response to determining that the first image signal exceeds the predetermined threshold, labeling the first image signal with an indication bit that instructs the readout circuitry to overwrite the first image signal on the memory circuit with the second image signal.

6. The method defined in claim 1, wherein the first image signal comprises a first reset-level signal and a first image-level signal, the method further comprising:

with the readout circuitry, sampling the first reset-level signal onto sample and hold circuitry;

with analog-to-digital converter circuitry on the readout circuitry, converting the first reset-level signal into a first digital reset-level signal subsequent to sampling the first reset-level signal onto the sample and hold circuitry;

with the readout circuitry, sampling the first image-level signal onto the sample and hold circuitry subsequent to converting the first reset-level signal into the first digital reset-level signal; and with the analog-to-digital converter circuitry, converting the first image-level signal into a first digital image-level signal subsequent to sampling the first image-level signal onto the sample and hold circuitry.

7. The method defined in claim 6, wherein the second image signal comprises a second reset-level signal and a second image-level signal, the method further comprising:

with the readout circuitry, sampling the second image-level signal onto the sample and hold circuitry;

with the analog-to-digital converter circuitry, converting the second image-level signal into a second digital image-level signal subsequent to sampling the second image-level signal onto the sample and hold circuitry;

with the readout circuitry, sampling the second reset-level signal onto the sample and hold circuitry subsequent to converting the second image-level signal into the second digital reset-level signal;

with the analog-to-digital converter circuitry, converting the second reset-level signal into a second digital image-level signal subsequent to sampling the second reset-level signal onto the sample and hold circuitry.

8. The method defined in claim 7, further comprising:

with the readout circuitry, outputting the first image signal to the image processing circuitry without outputting the second image signal.

9. A method of operating an image sensor coupled to image processing circuitry, wherein the image sensor comprises an array of image sensor pixels and readout circuitry, the method comprising:

with an image sensor pixel in the array, capturing a first image signal while a dual conversion gain gate in the image sensor pixel is turned off;

with the image sensor pixel, capturing a second image signal subsequent to capturing the first image signal while the dual conversion gain gate is turned on;

with a memory circuit in the readout circuitry, storing first image signal;

with the readout circuitry, identifying a selected one of the first and second image signals to output to the image processing circuitry based on the captured first image signal, wherein identifying the selected one of the first and second image signals to output to the image processing circuitry comprises:

determining whether the first image signal exceeds a predetermined threshold; and in response to determining that the first image signal exceeds the predetermined threshold, overwriting the first image signal on the memory circuit with the second image signal; and with the readout circuitry, outputting the identified image signal to the image processing circuitry.

10. The method defined in claim 9, wherein identifying the selected one of the first and second image signals to output to the image processing circuitry further comprises:

in response to determining that the first image signal exceeds the predetermined threshold, labeling the first image signal with an indication bit that instructs the readout circuitry to overwrite the first image signal on the memory circuit with the second image signal.

* * * * *